United States Patent [19]

Sun

[11] Patent Number: 5,654,909

[45] Date of Patent: Aug. 5, 1997

[54] 90-DEGREE DIGITAL PHASE SHIFT NETWORK AND LINEARIZER USING ALL-PASS DIGITAL FILTERS

[75] Inventor: Weimin Sun, Ikoma-gun, Japan

[73] Assignee: Icom Incorporated, Osaka, Japan

[21] Appl. No.: 220,430

[22] Filed: Mar. 30, 1994

[30] Foreign Application Priority Data

| Apr. 15, 1993 | [JP] | Japan | 5-088521 |
| Apr. 19, 1993 | [JP] | Japan | 5-091234 |
| Dec. 28, 1993 | [JP] | Japan | 5-336829 |

[51] Int. Cl.[6] ............................................. G06F 17/10
[52] U.S. Cl. ............................................. 364/724.011
[58] Field of Search ....................... 364/724.01, 724.17, 364/724.18, 724.16, 724.03, 724.11

[56] References Cited

U.S. PATENT DOCUMENTS

| 3,895,321 | 7/1975 | Seidel | 333/109 |
| 4,495,643 | 1/1985 | Orban | 381/94 |
| 4,701,717 | 10/1987 | Radermacher et al. | 330/149 |
| 4,987,378 | 1/1991 | Eggleston et al. | 330/149 |

FOREIGN PATENT DOCUMENTS

| 62-98808 | 5/1987 | Japan . |
| 62-166605 | 7/1987 | Japan . |

OTHER PUBLICATIONS

S. Darlington, "Realization of a Constant Phase Difference", *Bell Sys. Tech. Jour.*, vol. XXIX, pp. 94–104 (Jan. 1950).

D.K. Weaver, "Design of RC Wide–Band 90–Degree Phase–Difference Network", *Proc. of the I.R.E.*, pp. 671–676, (Apr. 1954).

D.E. Norgaard, "The Phase–Shift Method of Single Sideband Signal Generation", *Proc. of the I.R.E.*, pp. 1718–1734 (Dec. 1956).

L.R. Rabiner and R.W. Schafer, "On the Behavior of Minimax FIR Digital Hilbert Transformers", *Bell Sys. Tech. Jour.*, vol. 53, No. 2, pp. 363–390 (Feb. 1974).

S. Pei and J. Shyu, "Eigen–Approach for Designing FIR Filters and All–Pass Phase Equalizers with Prescribed Magnitude and Phase Response", *IEEE Trans. Circuit & Syst.*, vol. 39, No. 3, pp. 137–146 (Mar. 1992).

R. Ansari, "Elliptic Filter Design for a Class of Generalized Halfband Filters", *IEEE Trans. Acoust. Speech & Signal Processing*, vol. ASSP–33, No. 4., pp. 1146–1150 (Oct. 1985).

R. Ansari, "IIR Discrete–Time Hilbert Transformers", *IEEE Trans. Acoust. Speech & Signal Proc.*, vol. ASSP–35, No. 8, pp. 1116–1119 (Aug. 1987).

P.P. Vaidyanathan, P.A. Regalia and S.K. Mitra, "Design of Doubly Complementary IIR Digital Filters Using a Single Complex Allpass Filter, with Multirate Applications", *IEEE Trans. Circuit & Syst.*, vol. CAS–34, pp. 378–388 (Apr. 1987).

(List continued on next page.)

*Primary Examiner*—Chuong D. Ngo
*Attorney, Agent, or Firm*—Pennie & Edmonds LLP

[57] ABSTRACT

A 90-degree digital phase shift network includes at least two all-pass digital filters which have a phase difference of 90 degrees therebetween. These digital filters are adapted to receive the same signal. Each of the all-pass digital filters has phase characteristics $\theta(\omega)$ given by $$\theta(\omega) = \sum_{i=1}^{n'} \tan^{-1} \frac{4mP_iT \cdot \tan\left(\frac{\omega T}{2}\right)}{4m^2\tan^2\left(\frac{\omega T}{2}\right) - (P_iT)^2}$$

where T represents a sampling period, $P_i$ a real number indicative of a filter coefficient, $\omega$ the angular frequency, m a weight variable, $n'=n/2$ (n=even number), $n'=(n+1)/2$ (n=odd number), n an order of a 90-degree digital PSN, m being a positive value other than 1, and satisfying $|2m\omega|/|P_i|<1$ when $\omega T$ is sufficiently lower than 1, while satisfying $|-P_i\omega T^2|/2m<1$ when $\omega T$ is substantially equal to $\pi$.

12 Claims, 13 Drawing Sheets

OTHER PUBLICATIONS

N. Murakoshi, E. Watanabe and A. Nishihara, "A Synthesis of Variable IIR Digital Filters", *IEICE Trans. Fundamentals*, vol. E75-A, No. 3 (Mar. 1992).

S. Hsueh, Y. Baba and S. Takahashi, "Design of Two-Dimensional Digital Fan Filters with Complex Coefficients Using 90-Degree Phase-Difference Network", *Jour. of Soc. of Elec. Comm.*, vol. J68-A, No. 11, pp. 1193-1199 (Nov. 1985).

H. Ochi and D. Yamane, "Design of Digital All-Pass Network Using Lp Norm Estimation and Its Structure Optimizing", *Jour. of the Soc. of Elec. Comm.*, vol. J69-A, No. 12, pp. 1574-1554 (Dec. 1986).

M. Ikehara and S. Takahashi, "Construction of Hilbert Converter Using All-Pass Network with Variable $Z^2$", *Tech. Report of the Soc. of Elec. Inform. Comm.*, vol. CAS-87-151 (1987).

M. Ikehara, H. Tanaka and H. Matsuo, "Design of IIR Hilbert Transformers Using Remez Algorithm", *Jour. of the Soc. of Elec. Inform. Comm.*, vol. J74-A, No. 3, pp. 414-420 (Mar. 1992).

T. Yahagi, "Theory of Digital Signal Processing 2", *Corona Publishing Co., Ltd.*, (Nov. 1985).

K. Daikoku and S. Ogose, "RZ-SSB with Great Immunity to Fading" *Tech. Report of the Soc. of Elec. Inform. Comm.*, CS85-140, (Jan. 1986).

K. Suwa and K. Daikoku, "RZ-SSB Receiver Employing a Low Distortion Linearizer", *Tech. Report of the Soc. of Elect. Inform. Comm.*, CS-86-126 (1986).

K. Daikoku, "Single Sideband for Mobile Radio Communications—RZ-SSB Having Great Immunity from Fading and Interference", *Jour. of the Soc. of Elec. Inform. Comm.*, vol. 73, No. 5, pp. 508-514 (May 1990).

S. Ogose and K. Daikoku, "A Real Zerotransceiver: A Simple Method of Demodulating SSB Signals Without an Envelope", *Nippon Telegraph and Telephone Corp. Masashino Elec. Comm. Laboratories*, vol. 85, No. 104, pp. 9-16, CS85-30 (1986).

K. Daikoku, S. Ogose and H. Ohdate, "Experiments on Real Zero SSB Transceiver—Demodulation of SSB Without Envelope", *Proc. 35th IEEE Veh. Tech. Conf.*, pp. 183-190 (May 21-23 1985).

K. Suwa and K. Doikoku, "Evaluation of RZ SB Receivers Employing an Improfed Linearizer", *IEEE Veh. Tech. Conf.*, pp. 498-504 (1987).

K. Daikoku, S. Ogose and H. Ohdate, "A Real Zero SSB Transceiver for Land Mobile Radio: A Simple Method of Demodulating SSB Without an Envelope", *IEEE Trans. Veh. Tech.*, vol. VT-35, No. 1, pp. 22-29 (Feb. 1986).

J. Suzuki and K. Yoshiya, "Single Side-Band Communications as Old and New Transmission Techniques", *Newsletter from General Lab for Communication (Tsushin Sogo Kenkyujyo Kiho)*, vol. 34, No. 171, pp. 83-99 (Jun. 1988).

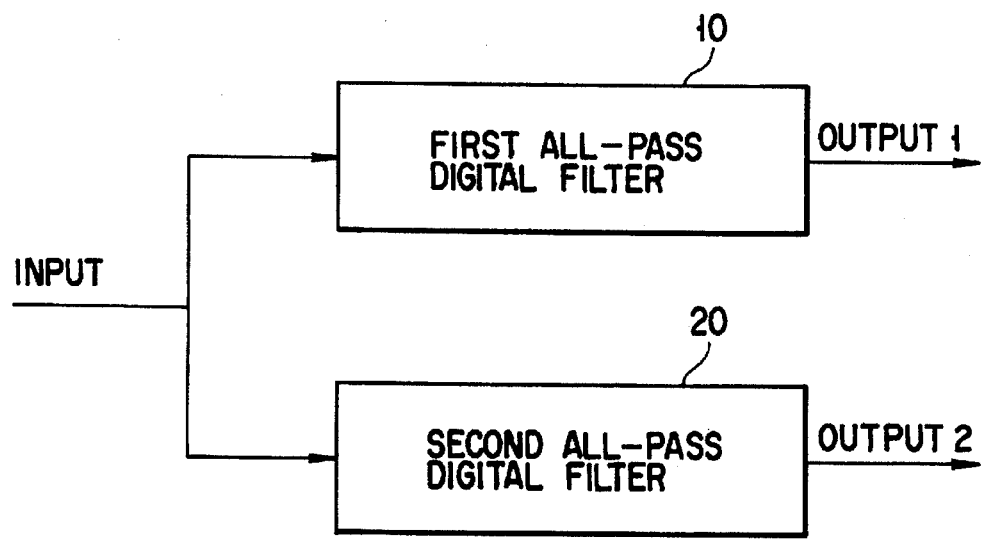
F I G. 4

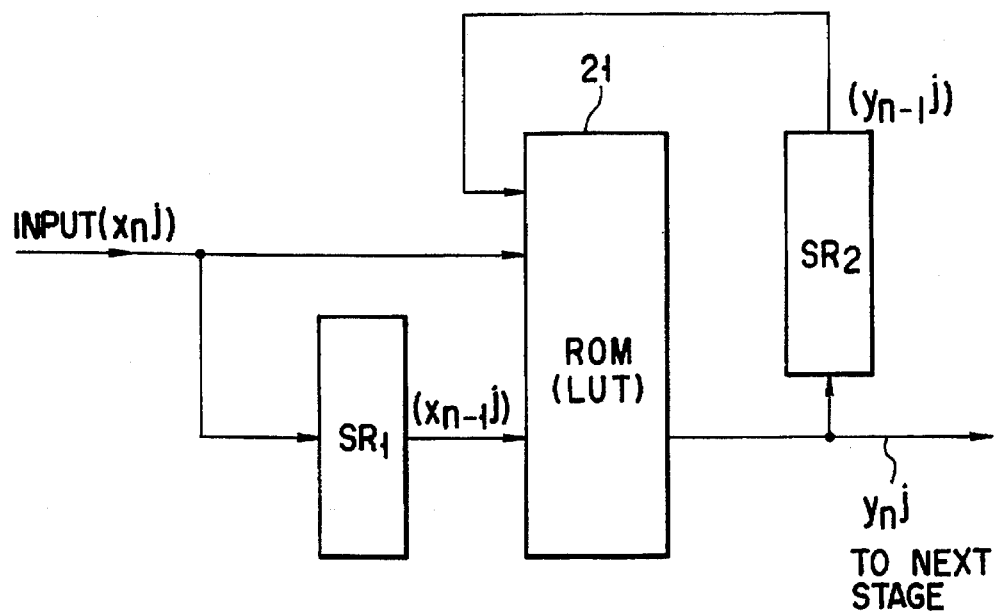
F I G. 7
| $x_n{}^j$ | $x_{n-1}{}^j$ | $y_{n-1}{}^j$ | ROM DATA |
|---|---|---|---|
| 1 | 1 | 1 | $b_{i-1} + b_i$ |
| 1 | 1 | 0 | $b_{i-1}$ |
| 1 | 0 | 1 | $b_i + b_i$ |
| ⋮ | ⋮ | ⋮ | ⋮ |
| 0 | 0 | 1 | $b_i$ |
| 0 | 0 | 0 | 0 |
F I G. 8

90-DEGREE DIGITAL PHASE SHIFT NETWORK AND LINEARIZER USING ALL-PASS DIGITAL FILTERS

BACKGROUND OF THE INVENTION

1. Field of the Invention

This invention relates to a 90-degree digital phase shift network comprising a plurality of all-pass digital filters, and a method for producing the net-work, and more particularly to a network of this kind capable of obtaining good characteristics in a low-frequency band. Further, the invention relates to a linearizer which employs all-pass digital filters.

2. Description of the Related Art

A 90-degree digital Phase Shift Network (PSN) is widely used in modulation/demodulation processes in the field of communication. In general, the PSN comprises two all-pass digital filters.

Digital filters have digital elements such as an adder, a multiplier, a register, etc., and are mainly sorted into FIR (Finite Impulse Response) digital filters and IIR (Infinite Impulse Response) digital filters, which will be hereinafter called "IIR-DF"s. In the recent years, there has been a tendency to use the IIR-DF as the 90-degree digital PSN, since it can provide high precision even when it incorporates relatively low order filters.

FIG. 1 shows a simple first-order IIR-DF structure.

As is shown in FIG. 1, the IIR-DF comprises an input register (not shown) which stores an input signal x[k], an output register (not shown) which stores an output signal y[k], a coefficient register for holding a filter coefficient b, and an adder. The IIR-DF calculates b·y[k−1], then adds b·y[k−1] to the value x[k] of the input register, and stores the addition result in the output register, thus functioning as a first-order digital filter.

There are various types of IIR-DFs, such as a transposition type, a parallel type, and a serial type, and these are used each in its proper way.

The IIR-DF can be realized also in a software manner, that is, by means of a numerically arithmetic program operated in a hardware system such as an LSI (For example DSP: Digital Signal Processor).

The above conventional digital filter will be explained with the use of an n'-order digital filter of a serial type comprising first-order filter connected in series, for easy expansion of formulas. The digital filter of a serial structure comprising first-order filters will be referred to simply as "digital filter".

The digital filter is obtained by calculating a transfer function relating to an analog filter, expressed by the following equation (see, for example, D. K. Weaver, 'Design of RC wide-band 90-degree phase-difference network', Proc. IRE, pp. 671–676, Apr. 1954), then subjecting the calculated transfer function relating to the analog filter to bilinear z-transform to obtain the transfer function relating to the digital filter, and determining the structures of the hardware and software systems employed, on the basis of the obtained function relating to the digital filter. The 90-degree digital PSN comprises digital filters designed on the basis of the calculated transfer functions relating to the digital filters.

$$H(s) = \prod_{i=1}^{n'} \frac{s - P_i}{s + P_i}$$

In the above equation, H(s) represents a transfer function relating to an analog filter, n' represents the filter order, and $P_i$ represents the coefficient of the filter, which are all real numbers, and s represents the Laplacean Factor.

Further, there is known a method for producing a 90-degree digital PSN which employs IIR Hilbert transformers. These IIR Hilbert transformers are produced by the use of Remez exchange algorithm (see Masaaki Ikehara, Hiroyuki Tanaka, and Hirohumi Matsuo, 'Design of IIR Hilbert Transformers Using Remez Algorithm', IEICE Vol. J74-A, No. 3, pp. 414–420, Mar. 1992).

However, the obtained 90-degree digital PSN by this method cannot provide a good phase shift characteristics, in particular, in a low-frequency band.

Moreover, since the frequency characteristics of the conventional digital filter designed by Weaver method are limited by the band ratio, the phase error, and the filter order, it is difficult to change the characteristics of the digital filters or make them variable in the filter of design or use, and accordingly it is difficult to change the characteristics of the 90-degree digital PSN or to make them variable.

In the case of a linearizer, moreover, a RZ-SSB (Real Zero SSB) system as an improvement of the conventional SSB (Single Side Band) system has been proposed. This system is characterized in that an AGC (Automatic Gain Control) circuit and an AFC (Automatic Frequency Control) circuit, which are employed in the conventional SSB system, are not necessary, and that the system has a higher fading resistance than the conventional SSB system.

Here, the RZ-SSB system will be explained.

Where a signal having its band limited is represented by g(t) and its Hilbert transformation is represented by g⌒(t), an LSB signal s(t) of a full carrier SSB is expressed by the following equation:

$$s(t) = A_c[(1+M \cdot g(t)) \cdot \cos(\omega_c t) + M \cdot g\#(t) \cdot \sin(\omega_c t)] \qquad (1)$$

where $A_c$ and $\omega_c$ represent the amplitude and the angular frequency of a carrier, respectively, and M ($0 \leq M < 1$) a modulation index.

From the equation (1), the following equations (2) to (5) are obtained:

$$s(t) = A(t) \cdot \cos \theta(t) \qquad (2)$$

$$A(t) = A_c[(1+M \cdot g(t))^2 + (M \cdot g\#(t))^2]^{1/2} \qquad (3)$$

$$\theta(t) = \omega_c \cdot t - \omega(t) \qquad (4)$$

$$\omega(t) = \tan^{-1}[M \cdot g\#(t)/(1+M \cdot g(t))] \qquad (5)$$

The signal expressed by the equation (2) can be demodulated by the use of a demodulation circuit as shown in FIG. 2.

An input signal v(t) to a linearizer shown in FIG. 2 is given by the following equation, which is an expansion into power series of M (<1):

$$v(t) = M \cdot g\#(t) - M^2 \cdot g(t) \cdot g\#(t) + M^3 \cdot \qquad (6)$$
$$[(g(t))^2 \cdot g\#(t) - (g\#(t))^3/3] + O(M^4)$$

The output y(t) of the conventional linearizer using the Hilbert transformers can be given by $$y(t)=v(t)-v(t)\cdot v\#(t)+v(t)\cdot (v\#(t))^2/2-(v\#(t))^3/6. \quad (7)$$

In the equation (7), y(t) represents an output of the linearizer. Theoretically, when the signal v (t) has been input into the linearizer, the output y(t) given by the following equation (8) is obtained. That is, a Hilbert-transformed primitive signal g#(t) and a distortion $O(M^4)$ of a negligible level indicated by a four or more dimensional term are output.

$$y(t)=M\cdot g\#(t)+O(M^4) \quad (8)$$

The linearizer whose output is given by the equation (8) has a structure as shown in FIG. 3.

Since the Hilbert transformers shown in FIG. 3 have a rather complicated structure, the overall circuit of FIG. 3 is actually very complicated.

SUMMARY OF THE INVENTION

It is an object of the invention to provide a 90-degree digital phase shift network which can provide good characteristics, especially in a low frequency band, and which is not easily affected by a band ratio, a phase error, and/or filter order and also to provide a method of producing the network.

It is another Object of the invention to provide a linearizer of good characteristics, which uses the 90-degree digital phase shift network, is applicable to a demodulation circuit, etc., for processing RZ-SSB signals, and can be easily produced.

According to an aspect of the invention, there is provided a 90-degree digital phase shift network which includes at least two all-pass digital filters, having a phase difference of 90 degrees therebetween, for receiving the same signal, and is characterized in that each of the all-pass digital filters has phase characteristics $\theta(\omega)$ given by $$\theta(\omega) = \sum_{i=1}^{n'} \tan^{-1} \frac{4mP_iT\cdot \tan\left(\frac{\omega T}{2}\right)}{4m^2\tan^2\left(\frac{\omega T}{2}\right)-(P_iT)^2}$$

where T represents a sampling period, $P_i$ a real number indicative of a filter coefficient, $\omega$ the angular frequency of an input signal, m a weight variable, n'=n/2 (n=even number), n'=(n+1)/2 (n=odd number), n an order of a 90-degree digital PSN, m being a positive value other than 1, and satisfying $|2m\omega/|P_i||<1$ when $\omega T$ is sufficiently lower than 1, or satisfying $|1-P_i\omega T^2|/2m<1$ when $\omega T$ is substantially equal to $\pi$.

The value of the weight variable m is preferably one of 0.7 or less and 5 or more.

According to another aspect of the invention, there is provided a method of producing a 90-degree digital phase shift network with at least two all-pass digital filters by setting the phase characteristics of each of the all-pass digital filters so that the characteristics can satisfy a digital transfer function obtained by transforming an analog transfer function determined on the basis of the passband ratio and the phase error of an all-pass filter, comprising: the first step of obtaining the digital transfer function by the use of variable bilinear z-transform expressed by z=(2m+sT)/(2m−sT), m being a positive value other than 1, which satisfies $|2m\omega/|P_i||<1$ when $\omega T$ is sufficiently lower than 1, or satisfying $|1-P_i\omega T^2|/2m<1$ when $\omega T$ is substantially equal to $\pi$, where T represents a sampling period, $P_i$ a real number indicative of a filter coefficient, $\omega$ the angular frequency of an input signal, m a weight variable, n'=n/2 (n=even number), n'=(n+1)/2 (n=odd number), n an order of a 90-degree digital PSN; and the second step of setting the phase characteristics of each of the all-pass digital filters so as to satisfy the digital transfer function.

The value of the weight variable m is preferably one of 0.7 or less and 5 or more.

The 90-degree digital phase shift network of the invention and the method of producing the network can provide appropriate 90-degree phase shift characteristics especially in a low frequency band. The frequency characteristics can be changed by changing the value of the weight variable m. It may be constructed such that an appropriate value of the weight variable m is found and fixed at the filter order of design, or that the weight variable m is changed at 90-degree digital PSN of use by means of a microprocessor or the like (a change in the weight variable causes a change in the digital transfer function).

The invention can provide good characteristics in a low frequency band, since the phase characteristics $\theta_a$ and $\theta_b$ of two all-pass digital filters A and B constituting the 90-degree digital phase shift network are set to values as given by the following equations:

$$\theta_a(\omega) = \sum_{i=1}^{n'} \tan^{-1} \frac{4mP_{ai}T\cdot \tan\left(\frac{\omega T}{2}\right)}{4m^2\tan^2\left(\frac{\omega T}{2}\right)-(P_{ai}T)^2}$$

$$\theta_b(\omega) = \sum_{i=1}^{n'} \tan^{-1} \frac{4mP_{bi}T\cdot \tan\left(\frac{\omega T}{2}\right)}{4m^2\tan^2\left(\frac{\omega T}{2}\right)-(P_{bi}T)^2}$$

Each of the above all-pass digital filters having the phase characteristics $\theta_a$ and $\theta_b$ can be obtained with the use of a digital transfer function calculated by subjecting a preset analog transfer function to variable bilinear z-transform. According to a further aspect of the invention, there is provided a linearizer characterized by comprising: a first all-pass filter, having phase characteristics of $\theta_a$, for receiving a predetermined input signal; a second all-pass filter, having phase characteristics of $\theta_b$, for receiving the predetermined input signal, the phase difference between the first and second all-pass filters satisfying $\tan((\theta_a-\theta_b)/2)=\pm 1$; a multiplying circuit for multiplying the output of the first all-pass filter by the output of the second all-pass filter; a third all-pass filter connected to an output of one of the first and second all-pass filters, the third all-pass filter having the same phase characteristics as the first all-pass filter in case of shifting a phase of the output of the first all-pass filter, and having the same phase characteristics as second all-pass filter in case of shifting a phase of the output of the second all-pass filter; and an adding circuit for adding the output of the third all-pass filter to the output of the multiplying circuit.

The linearizer is further characterized in that each of the first through third all-pass filters is produced to satisfy a digital transfer function obtained by subjecting an analog transfer function to variable bilinear z-transform expressed by z=(2m+sT)/(2m−sT), m being a positive value other than 1, which satisfies $|2m\omega/|P_i||<1$ when $\omega T$ is sufficiently lower than 1, while satisfying $|1-P_i\omega T^2|/2m<1$ when $\omega T$ is substantially equal to $\pi$, where T represents a sampling period, $P_i$ a real number indicative of a filter coefficient, $\omega$ the angular frequency, m a weight variable, n'=n/2 (n=even number), and n'=(n+1)/2 (n=odd number), n an order of a 90-degree digital PSN, whereby the low-frequency-band and high-frequency-band phase characteristics of a 90-degree digital phase shift network consisting of the first and second all-pass filters can be changed by changing the value of m.

The invention can provide a linearizer of high performance and a simple structure by means of a simple production method.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a block diagram, showing a 90-degree digital PSN according to a first embodiment of the invention;

FIG. 7 is a block diagram, showing another example of a digital filter constituting the 90-degree digital PSN of the first embodiment of the invention;

FIG. 8 is a table, showing an example of data items stored in a ROM (Read Only Memory) shown in FIG. 7;

DETAILED DESCRIPTION OF THE PREFERRED EMBODIMENTS

Figure 1:
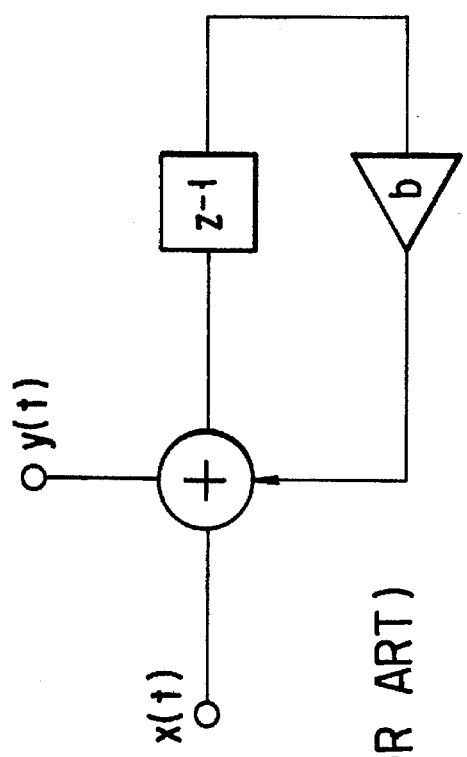
FIG. 1 is a circuit diagram, showing the simplest first-order IIR digital filter.

The embodiments of the invention will be explained with reference to the accompanying drawings.

FIG. 4 shows a 90-degree digital PSN according to a first embodiment of the invention. As in the case of the conventional device, an explanation will be given of the first embodiment with the use of an n'-order digital filter of a serial type comprising first-order filters, for easy formula expansion.

The 90-degree digital PSN of the invention comprises a first all-pass digital filter 10 and a second all-pass digital filter 20, which receive the same input signal. The first and second all-pass filters 10 and 20 have phase characteristics $\theta_a$ and $\theta_b$ given by the following equations (9) and (10), respectively:

$$\theta_a(\omega) = \sum_{i=1}^{n'} \tan^{-1} \frac{4mP_{ai}T \cdot \tan\left(\frac{\omega T}{2}\right)}{4m^2\tan^2\left(\frac{\omega T}{2}\right) - (P_{ai}T)^2} \quad (9)$$

$$\theta_b(\omega) = \sum_{i=1}^{n'} \tan^{-1} \frac{4mP_{bi}T \cdot \tan\left(\frac{\omega T}{2}\right)}{4m^2\tan^2\left(\frac{\omega T}{2}\right) - (P_{bi}T)^2} \quad (10)$$

where T represents a sampling period, n'=n/2 (n=even number), n'=(n+1)/2 (n=odd number), n an order of a 90-degree digital PSN, Pai and Pbi filter coefficients (real numbers), and $\omega$ the angular frequency. m represents a weight variable other than 1, which satisfies $|2m\omega/P_{ai}|<1$ and at the same time $|2m\omega/P_{bi}|<1$ when $\omega T$ is sufficiently lower than 1, while satisfying $|-P_{ai}\omega T^2|/2m<1$ and at the same time $|-P_{bi}\omega T^2|/2m<1$ when $\omega T$ is substantially equal to $\pi$. Experimental results indicate that the weight variable m is preferably 0.7 or less, or 5 or more.

Figure 5:
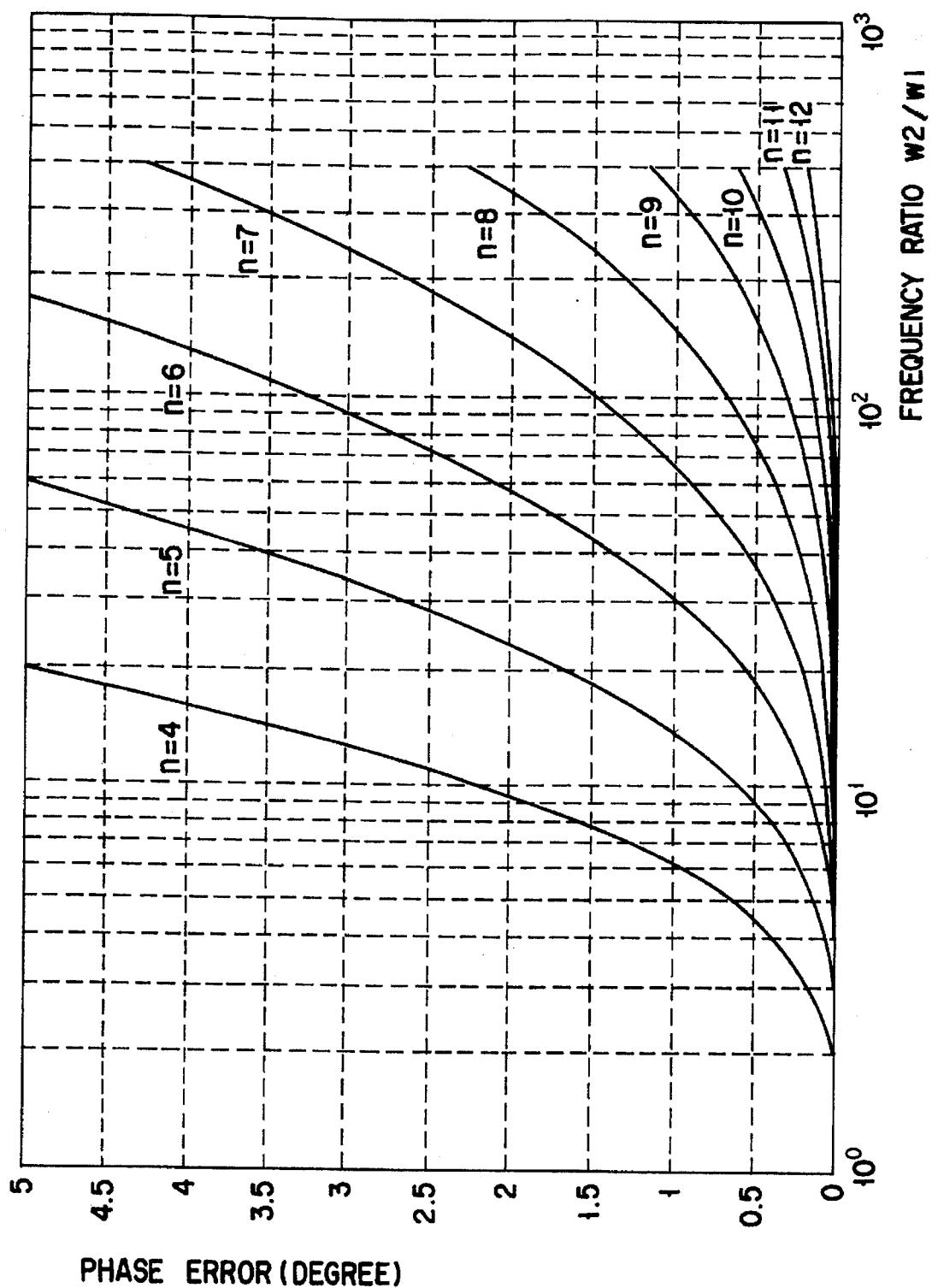
FIG. 5 is a graph, showing the relationship between the number n of 90-degree digital PSN orders, a phase error $\epsilon$, and the ratio $\omega_2/\omega_1$ of a low edge angular frequency $\omega_1$ to a high edge angular frequency $\omega_2$.

A method for producing the 90-degree digital PSN comprising all-pass filters with phase characteristics as given by the equations (9) and (10) will now be explained.

Where the low edge angular frequency of a phase shift band is represented by $\omega_1$, the high edge angular frequency of the same by $\omega_2$, and the 90-degree phase shift error by $\epsilon$, filter order is determined from the phase error $\epsilon$ (degree) and $\omega_2/\omega_1$, as is shown in FIG. 5. Thus, the coefficients $P_{ai}$ and $P_{bi}$ of the first and second all-pass digital filters 10 and 20 are obtained by the use of the following equations (11) to (21):

$$k'=\omega_1/\omega_2 \quad (11)$$

$$k=(1-k'^2)^{1/2} \quad (12)$$

$$\gamma=(1-k_1/2)/\{2 \cdot (1+k_1/2)\} \quad (13)$$

$$q'=\gamma+2\gamma^5+15\gamma^9+\ldots \quad (14)$$

$$q = \exp\{(\pi^2)/\ln(q')\}, \text{ where } \{\exp(x) = e^x\} \quad (15)$$

$$\alpha_{ai} = 90 \cdot (4i-3)/2n \quad (16)$$

where, $i = 1, 2, \ldots, [(n+1)/2]$.

$$\alpha_{bi} = 90 \cdot (4i-1)/2n \quad (17)$$

where, $i = 1, 2, \ldots, [n/2]$.

$$\beta_{ai} = \tan^{-1}\{(q^2-q^6)\cdot\sin(4\alpha_{ai})/(1+(q^2+q^6)\cdot\cos(4\alpha_{ai}))\} \quad (18)$$

$$\beta_{bi} = \tan^{-1}\{(q^2-q^6)\cdot\sin(4\alpha_{bi})/(1+(q^2+q^6)\cdot\cos(4\alpha_{bi}))\} \quad (19)$$

$$P_{ai} = (1/(k')^{1/2})\cdot\{\tan(\alpha_{ai}-\beta_{ai})\} \quad (20)$$

$$P_{bi} = (1/(k')^{1/2})\cdot\{\tan(\alpha_{bi}-\beta_{bi})\} \quad (21)$$

In the equations (16) and (17), [x] represents a maximum integer not higher than x.

The transfer function relating to the conventional digital filter is obtained by subjecting to bilinear z-transform an analog transfer function obtained with the use of the above-described conventional production method. However, the characteristics of the obtained conventional digital filter by Weaver method are limited by the relationship between the band ratio, the phase error, and the number of filter orders employed in the filter, and hence it is hard to obtain the desired characteristics by the above method. As a result, a phase difference of 90 degrees cannot be obtained in a low frequency band.

To overcome the above disadvantage, variable bilinear z-transform expressed by the following equation is employed in the present invention:

$$z = (2m+sT)/(2m-sT) \quad (22)$$

where T represents a sampling period, m a positive weight variable other than 1 (the experiment results indicate that 0.7 or less or 5 or more is preferable), and s a Laplacian Factor. The transfer functions $H_a(s)$ and $H_b(s)$ relating to the first and second all-pass digital filters 10 and 20 which are obtained by the use of an analog design method are expressed by the following equations (23) and (24), respectively:

$$H_a(s) = \prod_{i=1}^{n'} \frac{s - P_{ai}}{s + P_{ai}} \quad (23)$$

$$H_b(s) = \prod_{i=1}^{n'} \frac{s - P_{bi}}{s + P_{bi}} \quad (24)$$

where it is assumed that $n' = n/2$ (n: even number), and $n' = (n+1)/2$ (n: odd number).

Transfer functions $H_a(z)$ and $H_b(z)$ obtained by subjecting to variable bilinear z-transform the transfer functions $H_a(s)$ and $H_b(s)$ expressed by the equations (23) and (24) are expressed by the following equations (25) and (26), respectively:

$$H_a(Z) = \prod_{i=1}^{n'} \frac{a_i - z^{-1}}{1 - a_i z^{-1}} \quad (25)$$

$$H_b(z) = \prod_{i=1}^{n'} \frac{b_i - z^{-1}}{1 - b_i z^{-1}} \quad (26)$$

where $$a_i = (2\cdot m - P_{ai}T)/(2\cdot m + P_{ai}T) \quad (27)$$

$$b_i = (2\cdot m - P_{bi}T)/(2\cdot m + P_{bi}T) \quad (28)$$

If $z = \exp(j\omega T)$ in the equations (25) and (26), the frequency response values $H_a(\omega)$ and $H_b(\omega)$ of the first and second all-pass digital filters 10 and 20 are expressed by the following equations (29) and (30), respectively:

$$H_a(\omega) = \prod_{i=1}^{n'} \frac{a_i - \exp(-j\omega T)}{1 - a_i \cdot \exp(-j\omega T)} \quad (29)$$

$$H_b(\omega) = \prod_{i=1}^{n'} \frac{b_i - \exp(-j\omega T)}{1 - b_i \cdot \exp(-j\omega T)} \quad (30)$$

The phase characteristics of the equations (29) and (30) are given by the following equations (31) and (32), respectively:

$$\theta_a(\omega) = \sum_{i=1}^{n'} \tan^{-1} \frac{(a_i^2 - 1)\cdot\sin(\omega T)}{2a_i - a_i^2 \cdot \cos(\omega T) - \cos(\omega T)} \quad (31)$$

$$\theta_b(\omega) = \sum_{i=1}^{n'} \tan^{-1} \frac{(b_i^2 - 1)\cdot\sin(\omega T)}{2b_i - b_i^2 \cdot \cos(\omega T) - \cos(\omega T)} \quad (32)$$

Where the phase characteristics of the 90-degree digital PSN is expressed by $\theta'(\omega) = \theta_a(\omega) - \theta_b(\omega)$, the following approximate equation (33) is obtained, if $\omega T$ is sufficiently lower than 1:

$$\theta'(\omega) \approx \sum_{i=1}^{n'} \tan^{-1} \frac{(1+a_i)\omega T}{(1-a_i)} - \sum_{i=1}^{n'} \tan^{-1} \frac{(1+b_i)\omega T}{(1-b_i)} \quad (33)$$

By substituting the equations (27) and (28) in the equation (33), the phase shift characteristics $\theta'(\omega)$ of the 90-degree digital PSN are given by the following equation (34):

$$\theta'(\omega) = \sum_{i=1}^{n'} \tan^{-1} \frac{2m\omega}{P_{ai}} - \sum_{i=1}^{n'} \tan^{-1} \frac{2m\omega}{P_{bi}} \quad (34)$$

An appropriate value of the positive weight variable m which satisfies the following equations (35) and (36) is selected:

$$|2m\omega|/|P_{ai}| < 1 \quad (35)$$

$$|2m\omega|/|P_{bi}| < 1 \quad (36)$$

The following equation (37) is obtained from the Talor series of the equation (34):

$$\theta'(\omega) \approx \pm 2m\omega \sum_{i=1}^{n'} \tan^{-1}\left(\frac{1}{P_{ai}} - \frac{1}{P_{bi}}\right) \quad (37)$$

If $\omega$ is sufficiently low in the equation (37), the phase shift characteristics $\theta(\omega)$ of the 90-degree digital PSN are approximately expressed by a linear function of $\omega$. Thus, steep cut-off phase shift characteristics can be obtained in a low frequency band by changing the value of m within a range in which it satisfies the equations (35) and (36).

If $\omega T$ is substantially equal to $\pi$, the phase shift characteristics $\theta'(\omega)$ of the 90-degree digital PSN are approximately expressed by $$\Theta'(\omega) \cong \sum_{i=1}^{n'} \tan^{-1} \frac{(a_i - 1)\omega T}{(1 + a_i)} - \sum_{i=1}^{n'} \tan^{-1} \frac{(b_i - 1)\omega T}{(1 + b_i)} - \sum_{i=1}^{n'} \tan^{-1} \frac{(b_i - 1)\omega T}{} \quad (38)$$

As a result of substitution of the equations (27) and (28) in the equation (38), the phase shift characteristics of the 90-degree digital PSN is given by $$\theta'(\omega) = \sum_{i=1}^{n'} \tan^{-1}\frac{-P_{ai}\omega T^2}{2m} - \qquad (39)$$

$$\sum_{i=1}^{n'} \tan^{-1}\frac{-P_{bi}\omega T^2}{2m}$$

An appropriate value of the positive weight variable m which satisfies the following equations (40) and (41) is selected (the experimental results indicate that 0.7 or less or 5 or more is preferable):

$$|-P_{ai}\omega T^2/2m|<1 \qquad (40)$$

$$|-P_{bi}\omega T^2/2m|<1 \qquad (41)$$

From the Taylor series of the equation (39), the following equation is obtained:

$$\theta'(\omega) \approx \pm\frac{\omega T^2}{2m}\sum_{i=1}^{n'}(P_{ai}+P_{bi}) \qquad (42)$$

If ωT is substantially equal to π in the equation (42), steep cut-off phase shift characteristics can be obtained in a high frequency band by changing the value of m within a range in which it satisfies the equations (40) and (41).

The reason why the weight variable m does not effect a 90-degree phase shift error in the phase shift band will be explained.

The following equation is obtained by substituting the equations (27) and (28) in the equations (31) and (32), respectively:

$$\theta_a(\omega) = \sum_{i=1}^{n'} \tan^{-1}\frac{4mP_{ai}T\cdot\tan\left(\frac{\omega T}{2}\right)}{4m^2\tan^2\left(\frac{\omega T}{2}\right)-(P_{ai}T)^2} \qquad (43)$$

$$\theta_b(\omega) = \sum_{i=1}^{n'} \tan^{-1}\frac{4mP_{bi}T\cdot\tan\left(\frac{\omega T}{2}\right)}{4m^2\tan^2\left(\frac{\omega T}{2}\right)-(P_{bi}T)^2} \qquad (44)$$

As is evident from the equations (43) and (44), the weight variable m only affects the phase shift bands of the first and second all-pass digital filters 10 and 20. Further, as is evident from the equations (29) and (30), the weight variable m does not affect the amplitude characteristics.

Figure 6:
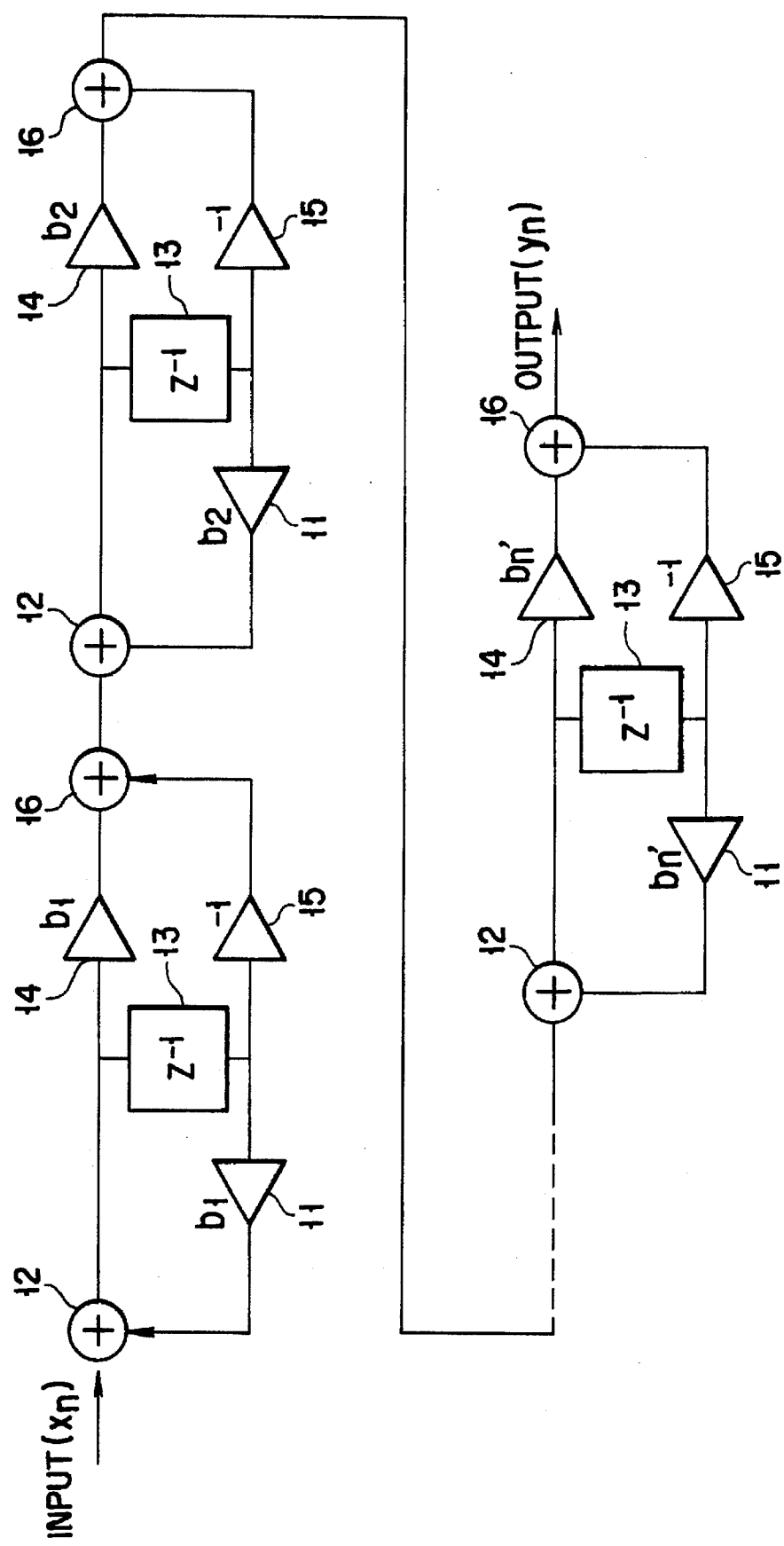
FIG. 6 is a block diagram, showing an example of a digital filter constituting the 90-degree digital PSN of the first embodiment of the invention.

An example of the 90-degree digital PSN of the invention consists of two all-pass digital filter 10 and 20 each having the structure as shown in FIG. 6. FIG. 6 shows an all-pass digital filter which has the phase characteristics expressed by equation (43) or (44).

As is shown in FIG. 6, an all-pass digital filter as employed in the invention comprises an n'-order digital filter formed of first-order digital filters connected in series. Each of the first-order filters comprises a multiplier 11 of a coefficient $b_i$, an adder 12 for adding an input signal to the output of the multiplier 11, a delay circuit (register) 13 for supplying the multiplier 11 with the output of the adder 12 after one sampling period, a multiplier 14 for multiplying the output of the adder 12 by $b_i$, a multiplier 15 for multiplying the output of the delay circuit 13 by −1, and an adder 16 for adding the outputs of the multipliers 14 and 15.

As is shown in FIG. 7, the all-pass digital filter may have a structure including a ROM. FIG. 7 shows only a first-order filter. The overall all-pass digital filter consists of the several first-order filters connected in series by the cascade method. In the figure, a ROM 21 is accessed by the use of three-bit address data indicated by $Y_{n-1}^j$, $X_n^j$, and $X_{n-1}^j$. Data is stored in a place addressed by each bit of the address data as shown in the Look Up Table of FIG. 8 (j denotes a bit number).

A shift register $SR_1$ shifts an input data $X_n$ by one bit and outputs the shifted data, while a shift register $SR_2$ shifts an output data $Y_n$ by one bit and outputs the shifted data.

The operation of the circuit of FIG. 7 will be explained. First, a 0-th bit data (i.e., Lowest Bit; LSB) $X_n^0$ of the input data $X_n$ is supplied to the ROM 21 and the shift register $SR_1$. At this time, the shift register $SR_1$ holds an input data $X_{n-1}$, and supplies the 0-th bit data (LSB) $X_{n-1}^0$ of the input data $X_{n-1}$ to the ROM 21, while the shift register $SR_2$ holds an output data $Y_{n-1}$ and supplies a 0-th bit data (LSB) $Y_{n-1}^0$ of the output data $Y_{n-1}$ is supplied to the ROM 21. A data register DR (not shown) holds a value of 0, and supplies its output data to an adder (not shown). The ROM 21 outputs the 0-th bit data $Yn^0$ of the output data $Y_n$ in accordance with the three bit data input therein. At this time, the shift registers $SR_1$ and $SR_2$ take in the input data. Sequentially, the shift registers $SR_1$ and $SR_2$ shift their holding values by one bit. Thus, the first through last bit data items are processed in the same manner. Two all-pass digital filters each having the above structure constitute the 90-degree digital PSN of the invention.

Although the above-described embodiment employs an n'-order digital filter comprising first-order filter connected in series, the n'-order digital filter may consist of second-order filter connected in series or in parallel.

Figure 9:
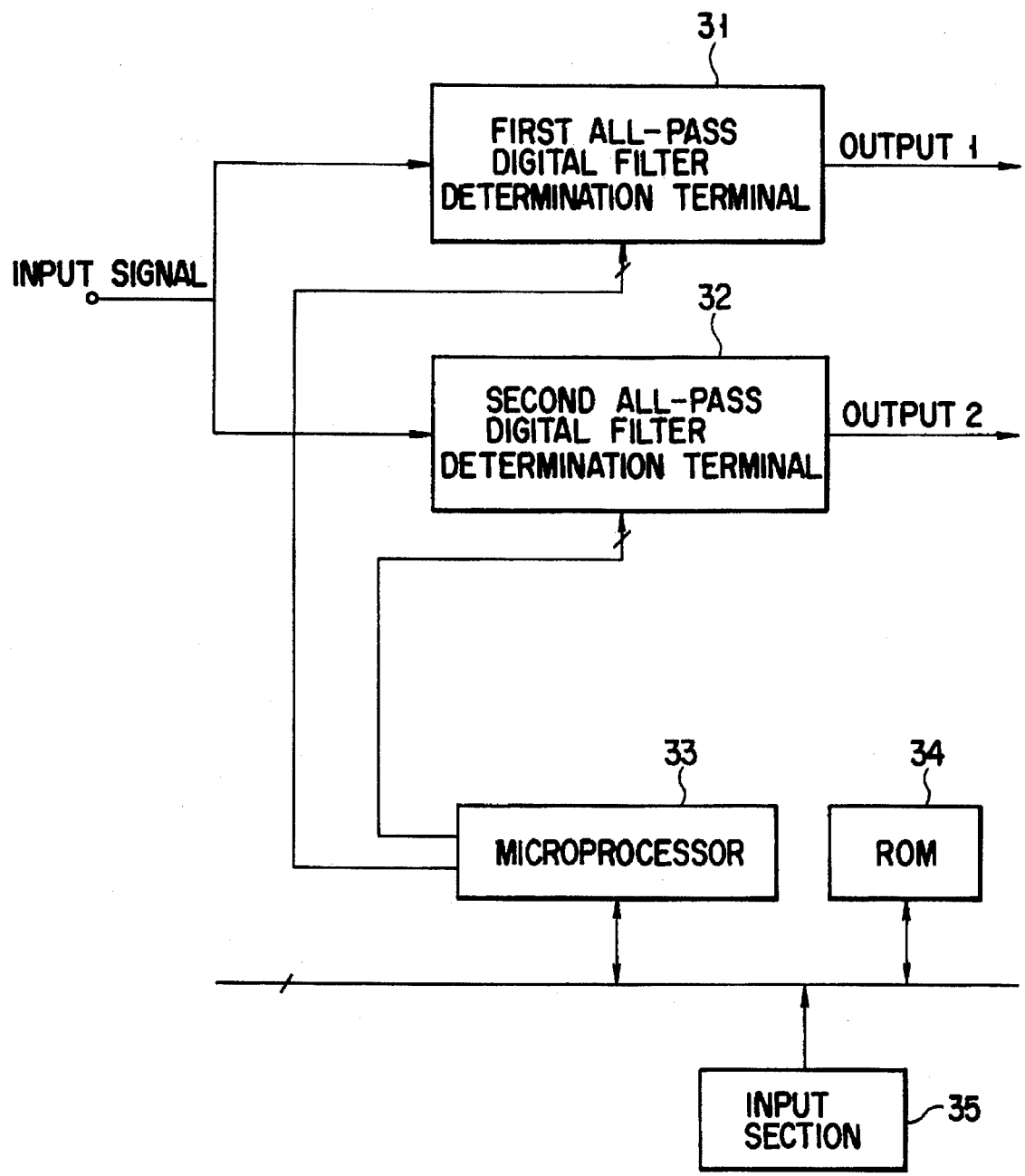
FIG. 9 is a block diagram, showing a 90-degree digital PSN system according to the first embodiment of the invention.

For example, the 90-degree digital PSN may be constructed as shown in FIG. 9 such that its characteristics can be changed in a desired manner.

In FIG. 9, the first and second all-pass digital filters 31 and 32 consist of LSIs. Each LSI has a structure in which the conditions set in the internal circuit (the coefficient of a multiplier, the address of ROM which stores data item, etc.) can be changed in accordance with a signal supplied from its determination terminal. A ROM 34 stores a program for performing the setting change. When the analog transfer function and the weight variable m are input through an input section 35, a microprocessor 33 calculates digital transfer functions for the first and second all-pass digital filters 31 and 32 with the use of the program stored in the ROM 34. Then, the microprocessor 33 supplies the first and second filters 31 and 32 with filter coefficient setting Signals, to change the setting in the LSIs so as to satisfy the transfer functions (in other words, all-pass filters which satisfy the calculated digital transfer functions are set or constructed to constitute a desired 90-degree digital PSN).

Thus, there can be provided a 90-degree digital PSN employing all-pass digital filters whose digital transfer functions can be changed by changing the analog digital function and the weight variable m in a desired manner.

It may be constructed such that the ROM 34 pre-stores a table of setting data items regarding analog transfer functions and weight variable m, and outputs desired contents of the ROM 34 to the determination terminals of the first and second all-pass digital filters 31 and 32, thus changing the characteristics of the 90-degree digital PSN.

Although the above explanation has been given of the n'-order digital filters each comprising first-order filter connected in series, for easy expansion of formulas, a digital filter comprising second-order filter connected in series or in parallel can also be changed in a desired manner.

An explanation will be given of the experimental results obtained with the use of digital filters produced by the conventional methods and the method of the invention.

Figure 10A:
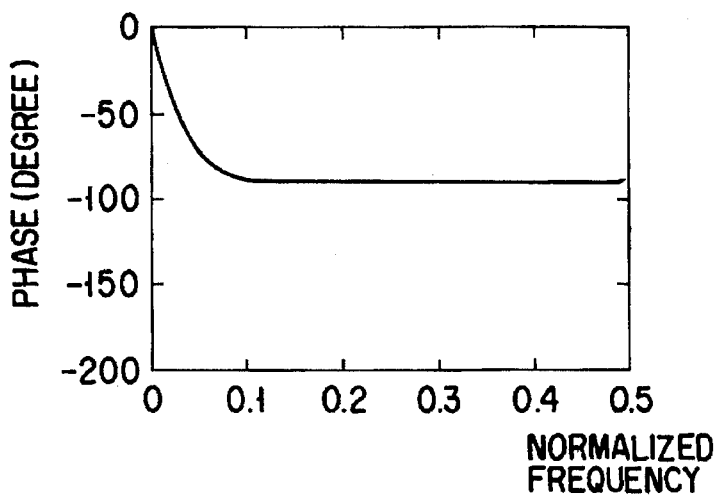
FIGS. 10A, 10B, and 10C are graphs, showing the phase characteristics of a conventional 90-degree digital PSN, the equal ripple characteristics of the same, and the phase characteristics of the same in a low frequency band, respectively.
Figure 10B:
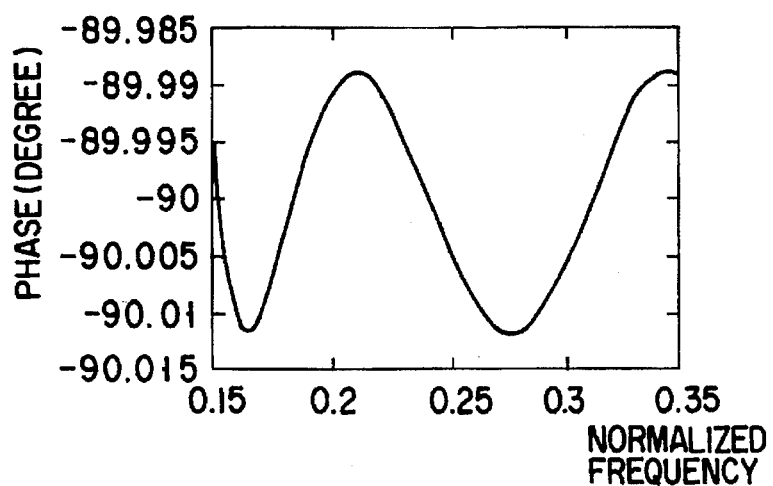
Figure 10C:
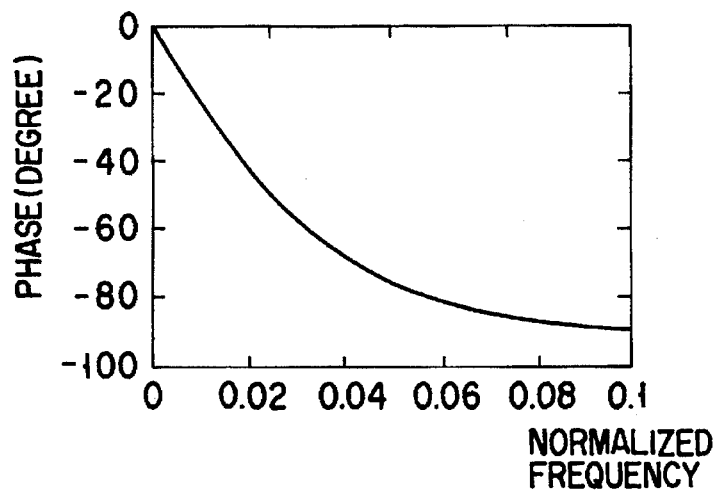

FIGS. 10A to 10C show the characteristics of a 90-degree digital PSN produced by setting an analog transfer function, and then subjecting the set analog transfer function to a bilinear z-transform. In this case, the band ratio is 100, and the phase shift error in the passband is 0.012 degrees. FIG. 10A shows the phase shift characteristics of the 90-degree digital PSN. In FIG. 10A, the ordinate indicates the degree of phase, and the abscissa indicates the normalized frequency. FIG. 10B shows the equal ripple characteristics of the passband of the 90-degree digital PSN. In FIG. 10B, the abscissa indicates the normalized frequency. FIG. 10C shows the phase shift characteristics in a low frequency band. In FIG. 10C, the ordinate indicates the degree of phase, and the abscissa indicates the normalized frequency.

Figure 11A:
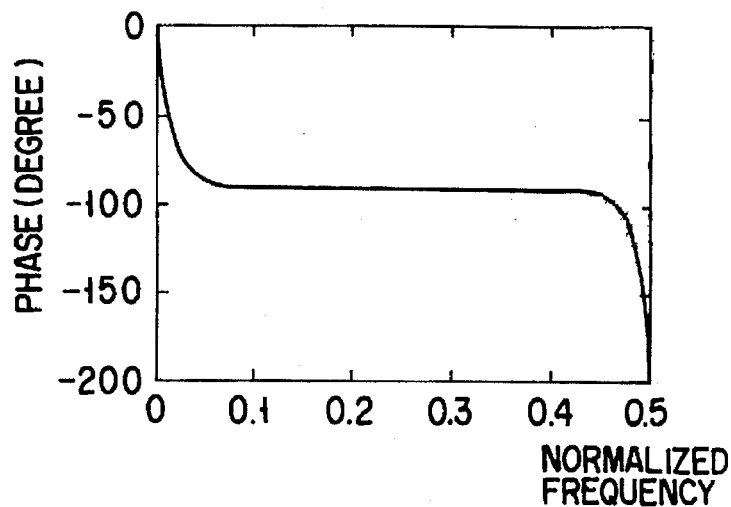
FIGS. 11A, 11B, and 11C are graphs, showing the phase characteristics of another conventional 90-degree digital PSN, the equal ripple characteristics of the same, and the phase characteristics of the same in a low frequency band, respectively.
Figure 11B:
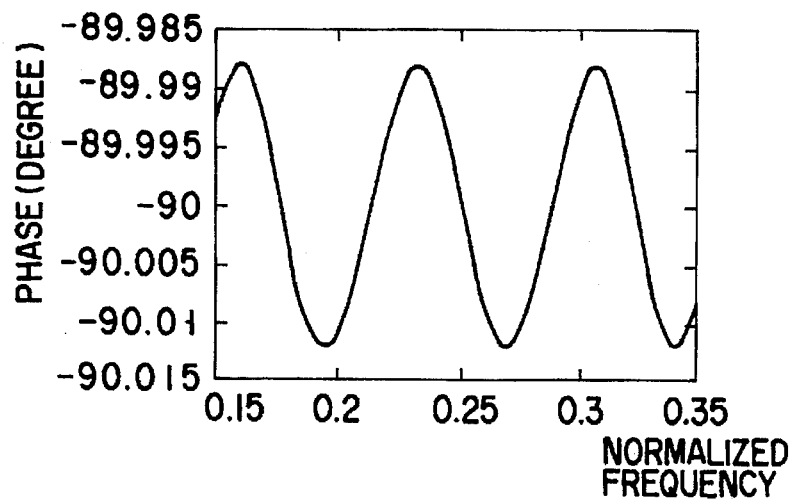
Figure 11C:
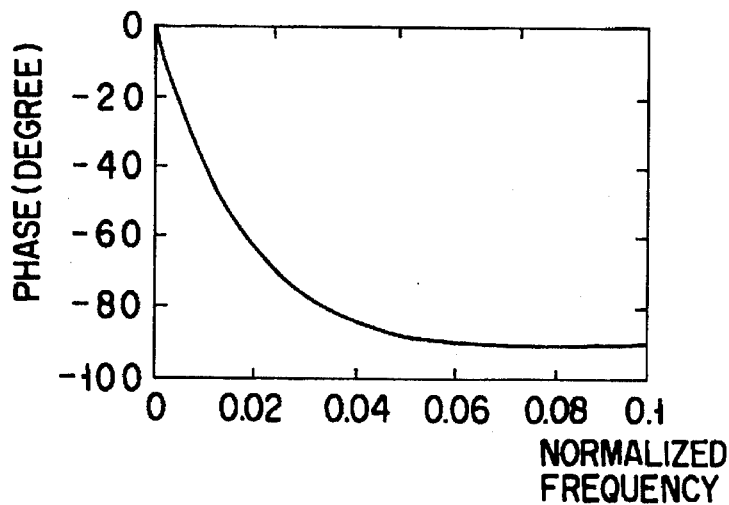

FIGS. 11A to 11C show the characteristics of a 90-degree digital PSN which employs 12-order Hilbert transformers produced by the use of the Remez exchange algorithm. The phase shift error in the passband is 0.012 degrees. FIG. 11A shows the phase shift characteristics of the PSN thus obtained. FIG. 11B shows the equal ripple characteristics of the passband of the PSN. FIG. 11C shows the phase shift characteristics in a low frequency band.

It is evident from FIGS. 10A to 11C that the two 90-degree digital PSNs produced by the conventional methods do not have sufficient 90-degree phase shift characteristics in a low frequency band.

Figure 12A:
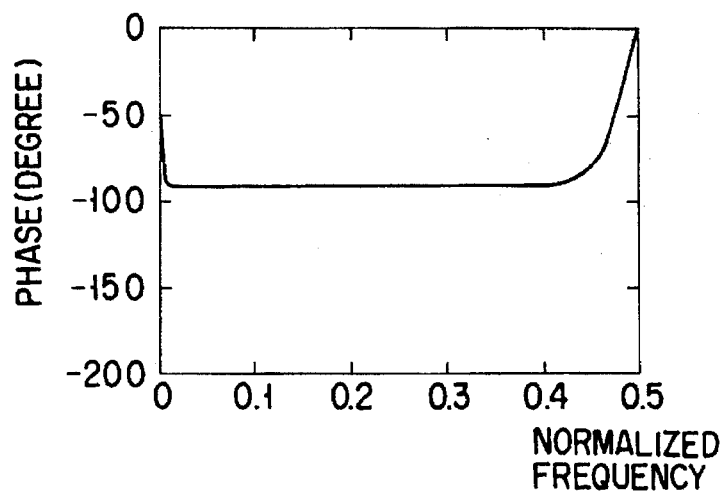
FIGS. 12A, 12B, and 12C are graphs, showing the phase characteristics of the 90-degree digital PSN according to the first embodiment of the invention, the equal ripple characteristics of the same, and the phase characteristics of the same in a low frequency band, respectively.
Figure 12B:
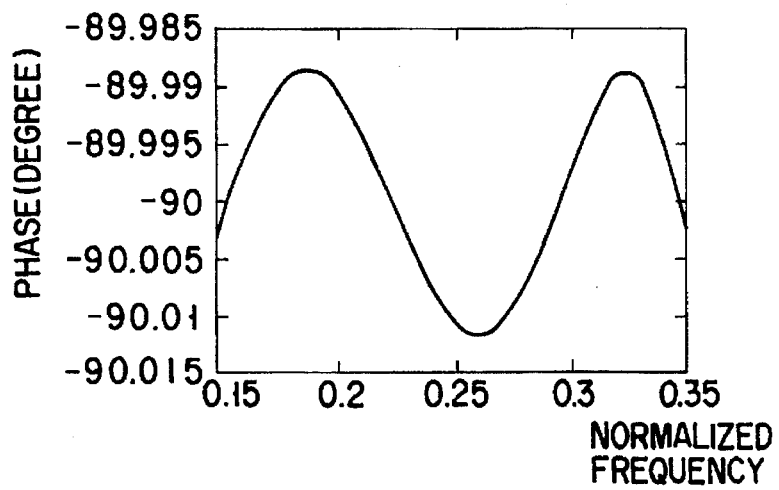
Figure 12C:
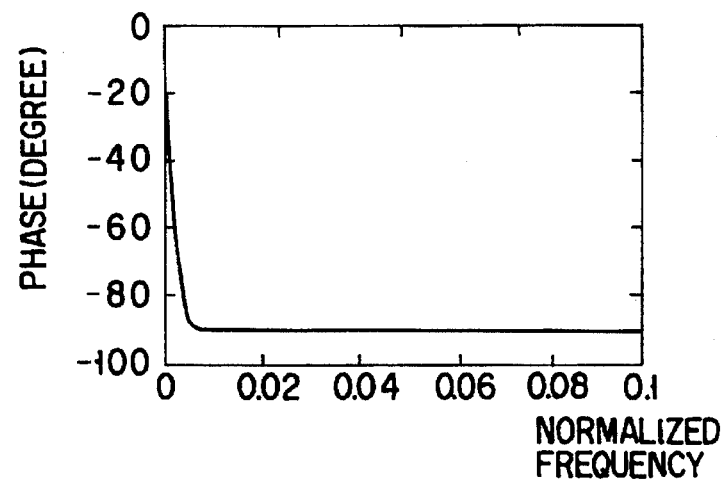

FIGS. 12A to 12C show an example of the characteristics of the 90-degree digital PSN of the invention. In this case, the band ratio and the phase shift error are identical to those in the cases shown in FIGS. 10A to 10C and FIGS. 11A to 11C, but the weight variable m is set to 20. FIG. 12A shows the phase shift characteristics of the PSN. FIG. 12B shows the equal ripple characteristics of the passband of the PSN. FIG. 12C shows the phase characteristics in a low frequency band. From FIGS. 12A to 12C, it can be understood that the 90-degree phase characteristics of the PSN of the invention in a low frequency band are superior than in the conventional cases.

Figure 13:
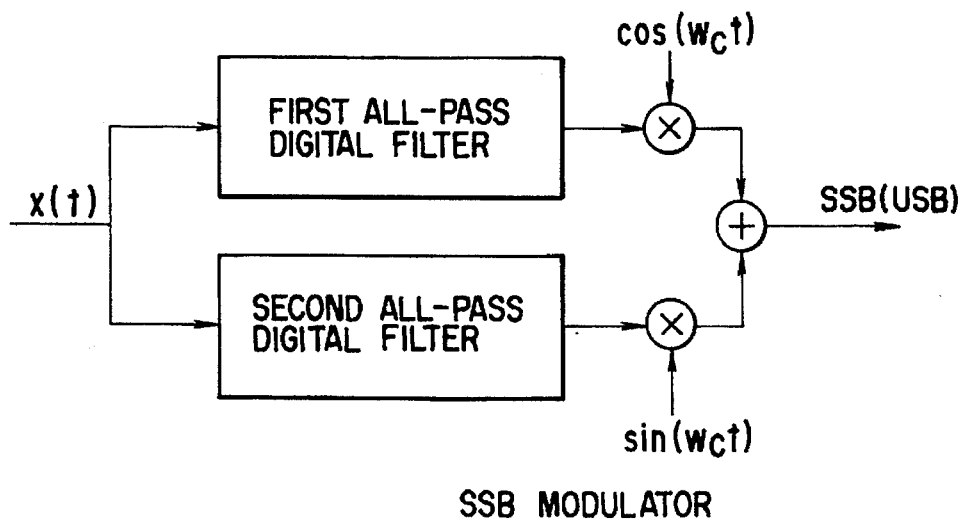
FIG. 13 is a block diagram, showing an SSB modulator which employs the 90-degree digital PSN of the first embodiment of the invention.

FIG. 13 shows an SSB modulator which employs the 90-degree digital PSN of the first embodiment of the invention. In the device of FIG. 13, the sampling frequency fs is 20 kHz, the carrier frequency $f_c$ of the input signal x(t) is set to $f_s/4$ ($\omega_c=2\pi f_c$). The 90-degree digital PSN has edge frequencies of 60 Hz and 4 kHz. The relationship between the phase error ε of the PSN and the attenuation amount Att of the unwanted side band is expressed by $$Att(dB)=20 \cdot \log \{\cot (\epsilon \pi/360)\}$$

Figure 14:
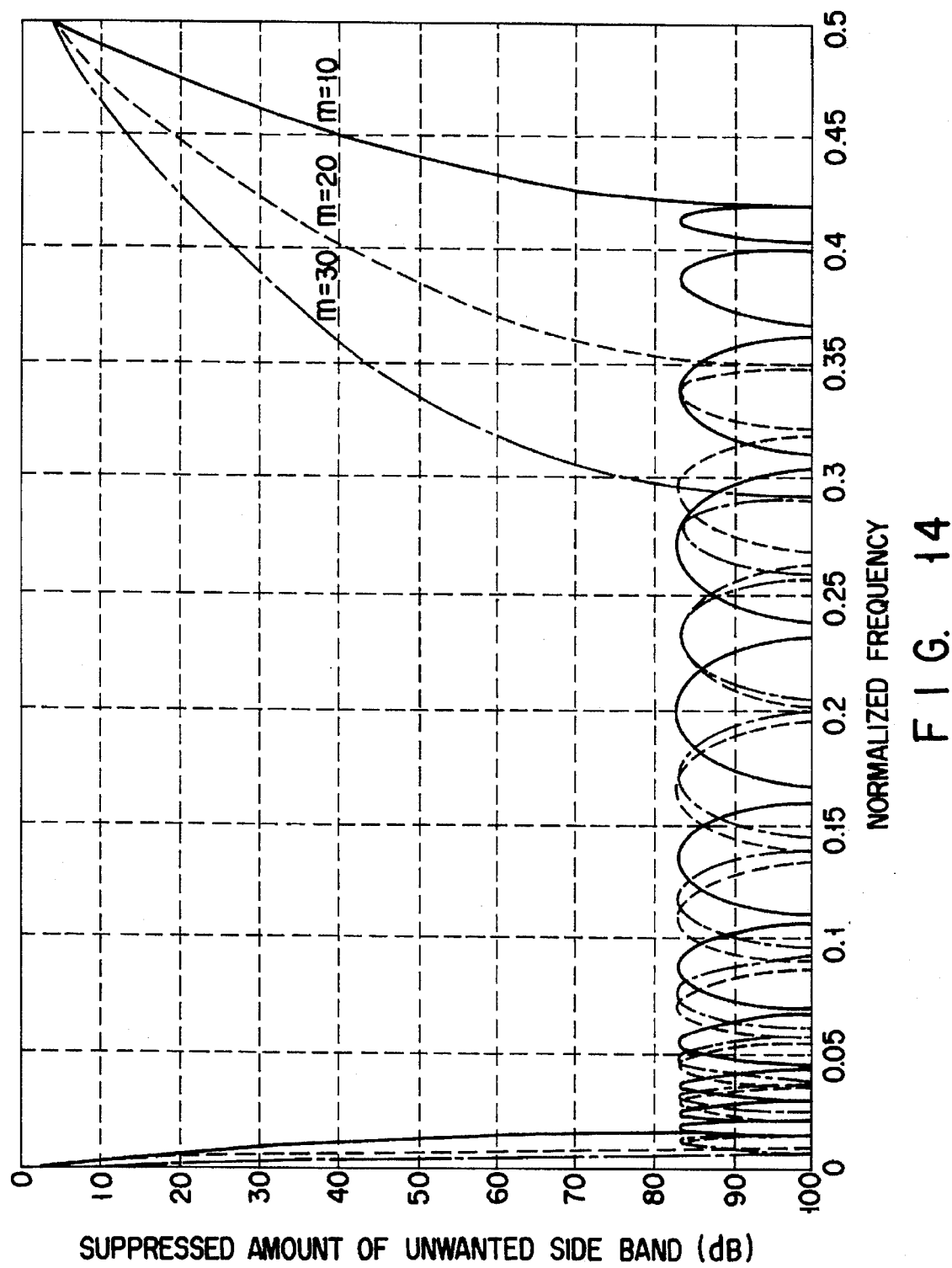
FIG. 14 is a graph, showing the relationship between a value of the weight variable m and the suppressed amount of the unwanted side band of the 90-degree digital PSN of the first embodiment of the invention.
Figure 15:
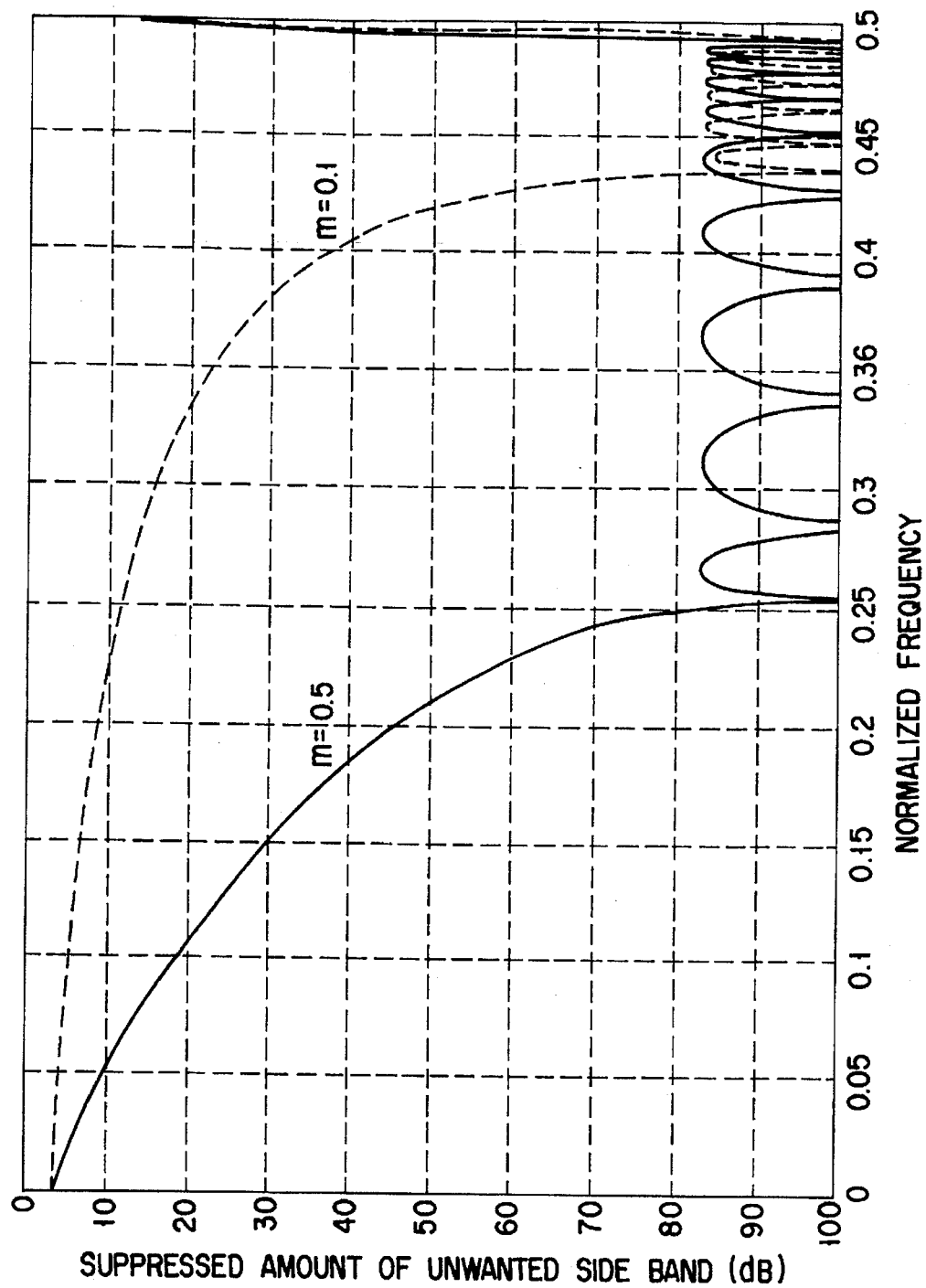
FIG. 15 is a graph, showing the relationship between another value of the weight variable m and the suppressed amount of the unwanted side band of the 90-degree digital PSN of the first embodiment of the invention.

FIGS. 14 and 15 show the relationship between the suppressed amount of the unwanted side band and the weight variable m of the SSB modulator as shown in FIG. 13. It is evident from FIG. 14 and 15 that the 90-degree phase shift characteristics in a low frequency band can be improved by increasing the weight variable m, and also that the phase band can be moved along the axis of frequency by changing the weight variable m. Further, it is understandable that the weight variable m little affects the phase error in the phase shift band.

Figure 16:
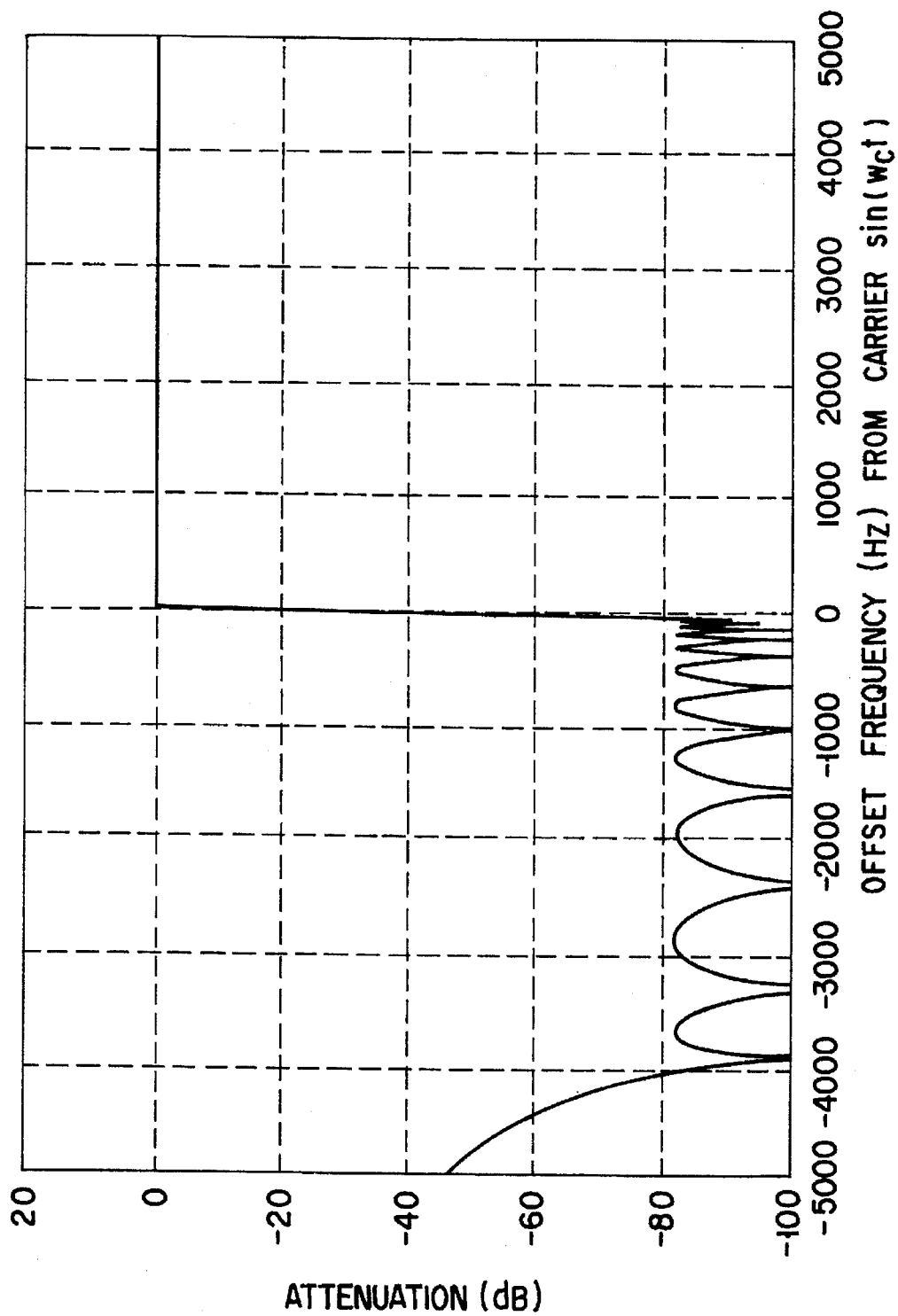
FIG. 16 is a graph, showing the characteristics of the SSB modulator of FIG. 13.

The above equation indicates that the phase shift error must be 0.12 degrees or less to set the minimum attenuation amount of the unwanted side band to 80 dB. To meet the requirement, the 90-degree digital PSN must have twelfth-order filter, and a weight variable m of 60. FIG. 16 shows the frequency characteristics of the 90-degree digital SSB modulator of the invention. It is evident from FIG. 16 that superior frequency characteristics and unwanted side band-suppressing characteristics can be obtained even in a low frequency band.

A linearizer according to a second embodiment of the invention and employing the above-described digital filter will be explained.

Figure 2:
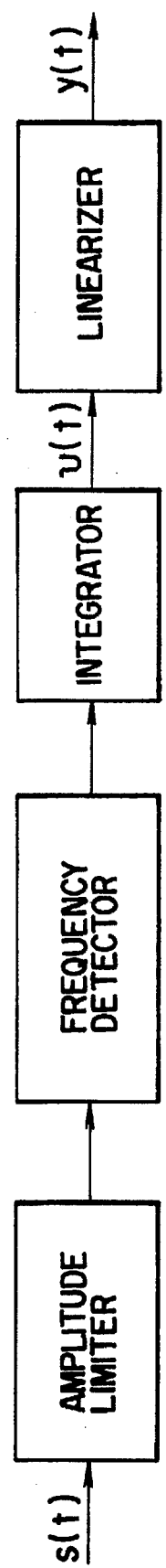
FIG. 2 is a block diagram, showing an example of a demodulation circuit for demodulating the conventional RZ-SSB.
Figure 3:
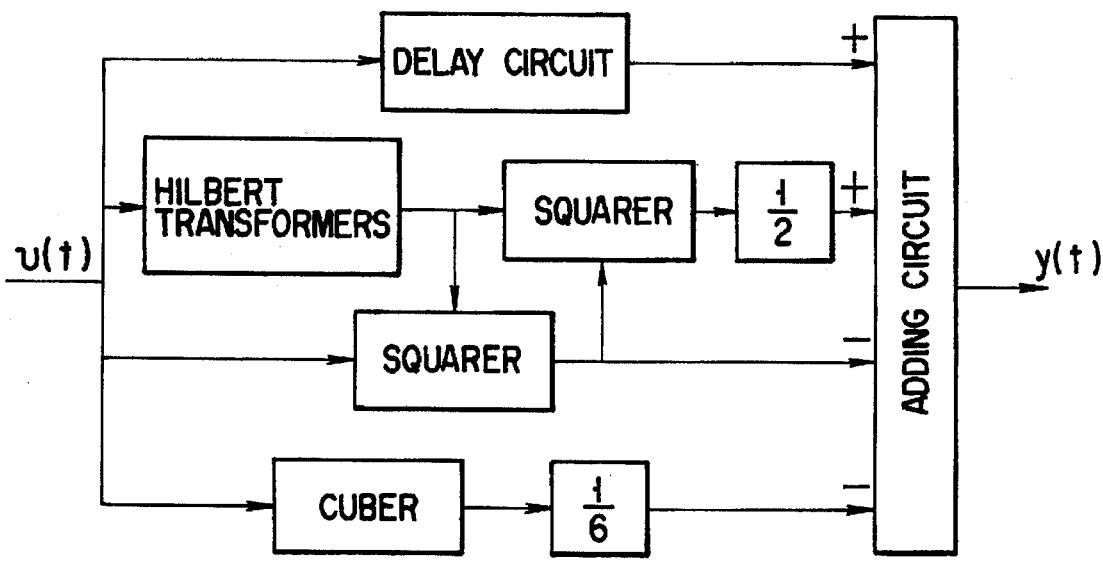
FIG. 3 is a block diagram, showing an example of a linearizer shown in FIG. 2.
Figure 17:
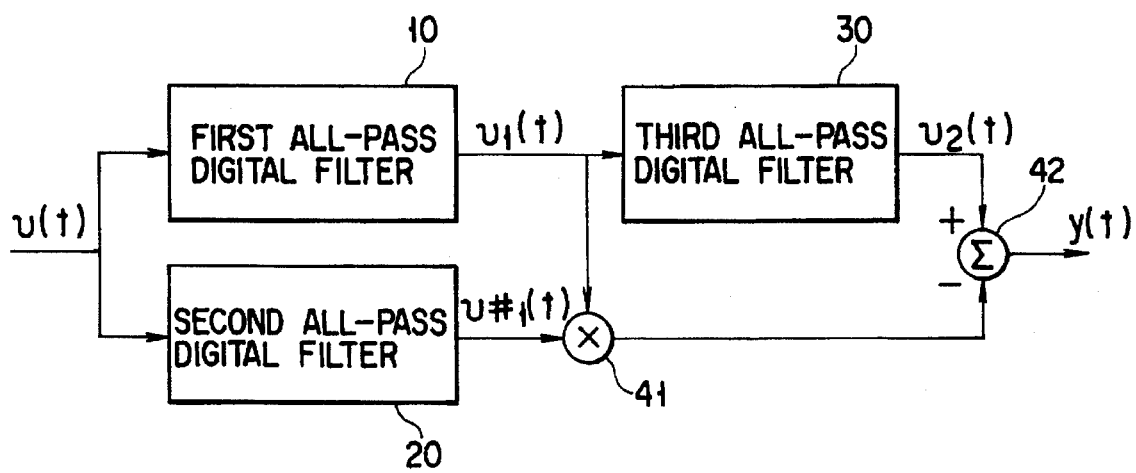
FIG. 17 is a block diagram, showing a linearizer according to a second embodiment of the invention.

As is shown in FIG. 17, the linearizer comprises first and second all-pass digital filters 10 and 20 which receive the same input signal from an integrator shown in FIG. 2, a multiplier 41 for multiplying the output of the first all-pass digital filter 10 by the output of the second all-pass digital filter 20, a third all-pass digital filter 30, having the same characteristics of the first all-pass digital filter 10, for shifting a phase of the output signal of the filter 10, and an adder 42 for subtracting the output signal of the multiplier 41 from the output signal of the third all-pass digital filter 30 (i.e., for performing negative addition). The phase difference between the first and second all-pass digital filters 10 and 20 is, for example, 90 degrees, i.e. satisfying $\tan((\theta_a-\theta_b)/2)=\pm 1$ (where $\theta_a$ is a phase characteristic of the first all-pass digital filter and $\theta_b$ is that of the second all-pass digital filter), and thus the all-pass digital filters 10 (or 31) and 20 (or 32) consists of a 90-degree digital PSN. The linearizer comprising the first, second and third all-pass digital filters 10, 20 and 30 has the structure shown in FIG. 17. And, the first and second all-pass digital filters constituting the 90-degree digital PSN as employed in the first embodiment of the invention are preferable. Because the phase shift characteristics of the 90-degree digital PSN in a low frequency band can be improved by the use of such an all-pass digital filter as employ in the first embodiment of the invention.

Theoretically, the linearizer shown in FIG. 17 can completely remove that two-dimensional distortion of the output signal θ (t) from the integrator, which is expressed by the equation (6), and can somewhat improve three-dimensional distortion of the same. The reason of this will be explained below.

Suppose that an original signal is given by $$g(t)=\sin(\theta_1(t))+\sin(\theta_2(t)) \quad (45)$$

In this case, the output of the integrator is given by $$\begin{aligned}v(t) = {} & M[\cos(\theta_1(t))+\cos(\theta_2(t))] - \\ & M^2[\sin(2\theta_1(t))+\sin(2\theta_2(t)) + \\ & 2 \cdot \sin(\theta_1(t)+\theta_2(t))]/2 - \\ & M^3[\cos(3\theta_1(t))+\cos(3\theta_2(t)) + \\ & 3 \cdot \cos(2\theta_1(t)+\theta_2(t)) + \\ & 3 \cdot \cos(\theta_1(t)+2\theta_2(t))]/3 + O(M^4)\end{aligned} \quad (46)$$

Where the phase characteristics of the first all-pass digital filter 10 is represented by φ (t), and those of the second filter 20 by φ (t)+π/2, the output $v_1$ (t) of the first filter 10 and the output $v\#_1(t)$ of the second filter 20 are given by $$\begin{aligned}v_1(t) = {} & M[\cos(\theta_1(t)+\phi(t)) + \\ & \cos(\theta_2(t)+\phi(t))] - \\ & M^2[\sin(2\theta_1(t)+\phi(t)) + \\ & \sin(2\theta_2(t)+\phi(t)) + \\ & 2 \cdot \sin(\theta_1(t)+\theta_2(t)+\phi(t))]/2 - \\ & M^3[\cos(3\theta_1(t)+\phi(t))+\cos(3\theta_2(t)+\phi(t)) + \\ & 3 \cdot \cos(2\theta_1(t)+\theta_2(t)+\phi(t)) + \\ & 3 \cdot \cos(\theta_1(t)+2\theta_2(t)+\phi(t))]/3 + O(M^4)\end{aligned} \quad (47)$$

-continued
$$v\#_1(t) = -M[\sin(\theta_1(t) + \phi(t)) + \qquad (48)$$
$$\sin(\theta_2(t) + \phi(t))] -$$
$$M^2[\cos(2\theta_1(t) + \phi(t)) +$$
$$\cos(2\theta_2(t) + \phi(t)) +$$
$$2 \cdot \cos(\theta_1(t) + \theta_2(t) + \phi(t))]/2 +$$
$$M^3[\sin(3\theta_1(t) + \phi(t)) + \sin(3\theta_2(t) + \phi(t)) +$$
$$3 \cdot \sin(2\theta_1(t) + \theta_2(t) + \phi(t)) +$$
$$3 \cdot \sin(\theta_1(t) + 2\theta_2(t) + \phi(t))]/3 + O(M^4)$$

The output $v_1(t) \cdot v\#_1(t)$ of the multiplier 41 is given by $$v_1(t) \cdot v\#_1(t) = -M^2[\sin(2\theta_1(t) + 2\phi(t)) + \qquad (49)$$
$$\sin(2\theta_2(t) + 2\phi(t)) + 2 \cdot \sin(\theta_1(t) +$$
$$\theta_2(t) + 2\phi(t))]/2 - M^3[\cos(3\theta_1(t) + 2\theta(t)) +$$
$$\cos(3\theta_2(t) + 2\theta(t)) + 3 \cdot \cos(2\theta_1(t) + \theta_2(t) +$$
$$2\phi(t)) + 3 \cdot \cos(\phi_1(t) + 2\theta_2(t) + 2\theta(t))]/2 +$$
$$O(M^4)$$

The output $v_2(t)$ of the third all-pass filter 30 is expressed by $$v_2(t) = M[\cos(\theta_1(t) + 2\phi(t)) + \qquad (50)$$
$$\cos(\theta_2(t) + 2\phi(t))] - M^2[\sin(2\theta_1(t) + 2\phi(t)) +$$
$$\sin(2\theta_2(t) + 2\phi(t)) + 2 \cdot \sin(\theta_1(t) +$$
$$\theta_2(t) + 2\phi(t))]/2 - M^3[\cos(3\theta_1(t) + 2\phi(t)) +$$
$$\cos(3\theta_2(t) + 2\phi(t)) + 3 \cdot \cos(2\theta_1(t) + \theta_2(t) +$$
$$2\phi(t)) + 3 \cdot \cos(\theta_1(t) + 2\theta_2(t) +$$
$$2\phi(t))]/3 + O(M^4)$$

Accordingly, the output y(t) of the linearizer is given by $$y(t) = v_2(t) - v_1(t) \cdot v\#_1(t) \qquad (51)$$
$$= M[\cos(\theta_1(t) + 2\phi(t)) + \cos(\theta_2(t) +$$
$$2\phi(t))] - M^3[\cos(3\theta_1(t) + 2\phi(t)) +$$
$$\cos(3\theta_2(t) + 2\phi(t)) + 3 \cdot \cos(2\theta_1(t) + \theta_2(t) +$$
$$2\theta(t)) + 3 \cdot \cos(\theta_1(t) + 2\theta_2(t) +$$
$$2\theta(t))]/6 + O(M^4)$$

It is understandable by comparing the equations (46) and (51) that the two-dimensional distortion ($M^2$ term) can be completely removed, and the three-dimensional distortion ($M^3$ term) can be reduced by 6 dB. Further, it can be understood that three or more dimensional distortion is almost negligible if the modulation index M is sufficiently lower than 1.

If the original signal g(t) is a voice signal, its demodulation signal may be output in the form of y(t) since the phase difference of voice signals cannot be detected by the ears of a man.

The linearizer comprising the first, second and third all-pass digital filters 10, 20 and 30 has the structure shown in FIG. 17. However, the characteristics in a low frequency band can be enhanced by the use of such an all-pass digital filter as employed in the first embodiment, i.e., by the use of a digital filter designed to satisfy a digital transfer function, which is obtained by subjecting a desired analog transfer function to variable bilinear z-transform expressed by $z=(2m+sT)/(2m-sT)$, satisfying $|2m\omega/P_i|<1$ when $\omega T$ is sufficiently lower than 1, while satisfying $|-P_i\omega T^2|/2m<1$ when $\omega T$ is substantially equal to $\pi$. (T represents a sampling period, $n'=n/2$ (n=even number), $n'=(n+1)/2$ (n=odd number), n an order of a 90-degree digital PSN, $P_i$ a filter coefficient (real number), $\omega$ the angular frequency, and m a weight variable.) In this method, the phase shift characteristics can be changed in a low or high frequency band by changing the weight variable m.

The method of producing the above digital filter constituting the 90-degree digital PSN is explained in the first embodiment of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A 90-degree digital phase shift network (PSN) which includes at least first and second all-pass digital filters, which receive the same input signal, and wherein each of the all-pass digital filters is constructed such that its phase characteristics $\theta(\omega)$ is given by $$\theta(\omega) = \sum_{i=1}^{n'} \tan^{-1} \frac{4mP_iT \cdot \tan\left(\frac{\omega T}{2}\right)}{4m^2\tan^2\left(\frac{\omega T}{2}\right) - (P_iT)^2}$$

where T represents a sampling period, $P_i$ a real number indicative of a filter coefficient, $\omega$ the angular frequency, m a weight variable, $n'=n/2$ (n=even number), $n'=(n+1)/2$ (n=odd number), n an order of a 90-degree digital PSN, m being a positive value other than 1, and satisfying $|2m\omega/P_i|<1$ when $\omega T$ is sufficiently lower than 1, while satisfying $|-P_i\omega T^2/2m|<1$ when $\omega T$ is substantially equal to $\pi$, so that output signals of the first and the second all-pass digital filters have a 90-degree phase difference therebetween.

2. The 90-degree digital phase shift network according to claim 1, wherein said weight variable m is one of 0.7 or less and 5 or more.

3. The 90-degree digital phase shift network according to claim 1, wherein each of said all-pass digital filters comprises a plurality of first-order digital filters connected in series, each of said first-order digital filters comprising a first multiplier, a first adder for adding an input signal to an output from the first multiplier, a delay circuit for delaying by one sampling period an output from the first adder and supplying the delayed output to the first multiplier, where the first multiplier multiplies the delayed output by a predetermined value, a second multiplier for multiplying the output of the first adder by a predetermined value, a third multiplier for multiplying the output of the delay circuit by $-1$, and a second adder for adding the output of the second multiplier to the output of the third multiplier.

4. The phase shift network of claim 3 wherein the first multiplier and the second multiplier use the same predetermined value as a multiplier.

5. The phase shift network according to claim 1 wherein each of said all-pass digital filters comprises a plurality of first-order digital filters connected in series, each of said first-order digital filters comprising first and second shift registers and a look-up table, said look-up table receiving inputs from the first and second shift registers and from an input to the first-order digital filter and providing an output from the first-order digital filter, said first shift register receiving an input from the input to the first-order digital filter and providing an output that is one of the inputs to the look-up table and said second shift register receiving an input from the output of the look-up table and providing an output that is another of the inputs to the look-up table.

6. The phase shift network of claim 5 wherein the look-up table is stored in a read only memory (ROM).

7. The phase shift network of claim 5 wherein the input to the look-up table from the first shift register is the previous input to the first-order digital filter and the input to the look-up table from the second shift register is the previous output from the first-order digital filter.

8. The 90-degree digital phase shift network according to claim 1 wherein each of said all-pass digital filters comprises a plurality of first-order digital filters connected in series, each of said first-order digital filters comprising first and second shift registers and a read only memory containing a look-up table, said read only memory receiving address inputs from the first and second shift registers and from an input to the first-order digital filter and providing an output from the first-order digital filter that is determined by said address inputs, said first shift register receiving an input from the address inputs to the read only memory and said second shift register receiving an input from the output of the look-up table, delaying it and providing an output that is another of the address inputs to the read only memory.

9. The 90-degree digital phase shift network according to claim 8 wherein the first and second shift registers each shift their input by one bit.

10. A linearizer comprising:

a first all-pass filter, having phase characteristics of $\theta_a$, for receiving a predetermined input signal;

a second all-pass filter, having phase characteristics of $\theta_b$, for receiving the predetermined input signal, the phase difference between the first and second all-pass filters satisfying $\tan((\theta_a-\theta_b)/2)=\pm 1$;

a multiplying circuit for multiplying the output of the first all-pass filter by the output of the second all-pass filter;

a third all-pass filter connected to an output of one of the first and second all-pass filters, the third all-pass filter having the same phase characteristics as the first all-pass filter in case of shifting a phase of the output of the first all-pass filter, and having the same phase characteristics as the second all-pass filter in case of filtering the output of the second all-pass filter; and an adding circuit for adding the output of the third all-pass filter to the output of the multiplying circuit.

11. The linearizer according to claim 10, wherein each of the first through third all-pass filters is designed to satisfy a digital transfer function obtained by subjecting an analog transfer function to a variable bilinear z-transform expressed by $z=(2m+sT)/(2m-sT)$, m being a positive value other than 1, which satisfies $|2m\omega|/|P_i|<1$ when $\omega T$ is sufficiently lower than 1, while satisfying $|-P_i\omega T^2|/2m<1$ when $\omega T$ is substantially equal to $\pi$, where T represents a sampling period, $P_i$ a real number indicative of a filter coefficient, $\omega$ the angular frequency, m a weight variable, whereby the low-frequency-band and high-frequency-band phase shift characteristics of a 90-degree digital phase shift network consisting of the first and second all-pass filters can be changed by changing the value of m.

12. A linearizer using a 90-degree digital phase shift network which has first and second all-pass filters, comprising:

a multiplying circuit for multiplying the output of the first all-pass filter by the output of the second all-pass filter;

a third all-pass filter, having the same phase characteristics as one of the first and second all-pass filters, for shifting a phase of the output of the one of the first and second all-pass filters; and an adding circuit for adding the output of the third all-pass filter to the output of the multiplying circuit.

* * * * *